US008020132B2

(12) United States Patent
Norman

(10) Patent No.: US 8,020,132 B2
(45) Date of Patent: Sep. 13, 2011

(54) COMBINED MEMORIES IN INTEGRATED CIRCUITS

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 805 days.

(21) Appl. No.: 12/004,292

(22) Filed: Dec. 19, 2007

(65) Prior Publication Data
US 2008/0109775 A1 May 8, 2008

(51) Int. Cl.
*G06F 17/50* (2006.01)
(52) U.S. Cl. .................................. 716/119; 716/132
(58) Field of Classification Search .................. None
See application file for complete search history.

(56) References Cited

U.S. PATENT DOCUMENTS

| | | | |
|---|---|---|---|
| 5,541,850 A * | 7/1996 | Vander Zanden et al. ...... 716/18 |
| 6,034,882 A | 3/2000 | Johnson et al. |
| 6,047,115 A * | 4/2000 | Mohan et al. .................... 716/16 |
| 6,105,105 A * | 8/2000 | Trimberger .................... 711/103 |
| 6,304,101 B1 * | 10/2001 | Nishihara ........................ 326/41 |
| 6,356,477 B1 * | 3/2002 | Tran ............................... 365/158 |
| 6,421,817 B1 * | 7/2002 | Mohan et al. .................... 716/16 |
| 6,798,689 B2 * | 9/2004 | Muller et al. ................... 365/158 |
| 6,966,044 B2 * | 11/2005 | Reuland et al. ................. 716/17 |
| 7,055,113 B2 * | 5/2006 | Broberg et al. ................... 716/1 |
| 7,069,523 B2 * | 6/2006 | Nation et al. ..................... 716/2 |
| 7,082,052 B2 * | 7/2006 | Rinerson et al. .............. 365/171 |
| 7,095,643 B2 * | 8/2006 | Rinerson et al. ................. 365/63 |
| 7,327,600 B2 | 2/2008 | Norman |
| 7,398,492 B2 * | 7/2008 | Youngman et al. ................ 716/5 |
| 7,430,725 B2 * | 9/2008 | Broberg et al. ................... 716/1 |
| 7,460,385 B2 | 12/2008 | Gruber et al. |
| 7,478,358 B2 * | 1/2009 | Fujimoto ........................ 716/17 |
| 7,538,338 B2 * | 5/2009 | Rinerson et al. ................. 257/4 |
| 7,554,873 B2 * | 6/2009 | Lee et al. .................. 365/230.03 |
| 7,593,284 B2 * | 9/2009 | Norman .................... 365/230.03 |
| 7,715,250 B2 * | 5/2010 | Norman ....................... 365/189.2 |
| 7,788,619 B2 * | 8/2010 | Sim ................................. 716/10 |
| 2003/0151959 A1 | 8/2003 | Tringali et al. |
| 2006/0171200 A1 * | 8/2006 | Rinerson et al. ............ 365/185.1 |
| 2006/0243955 A1 * | 11/2006 | Fujimoto ........................... 257/1 |
| 2008/0005459 A1 | 1/2008 | Norman |
| 2008/0084727 A1 | 4/2008 | Norman |
| 2009/0063757 A1 * | 3/2009 | Norman ......................... 711/103 |

OTHER PUBLICATIONS

U.S. Appl. No. 11/975,275, filed Oct. 17, 2007, Robert Norman.
U.S. Appl. No. 11/893,647, filed Aug. 16, 2007, Robert Norman.
U.S. Appl. No. 11/893,644, filed Aug. 16, 2007, Robert Norman.
U.S. Appl. No. 11/655,599, filed Jan. 19, 2007, Robert Norman.
U.S. Appl. No. 11/999,376, filed Dec. 4, 2007, Robert Norman.
U.S. Appl. No. 11/897,909, filed Aug. 30, 2007, Robert Norman.
U.S. Appl. No. 11/897,726, filed Aug. 31, 2007, Robert Norman.
U.S. Appl. No. 11/974,034, filed Oct. 10, 2007, Robert Norman.

\* cited by examiner

*Primary Examiner* — Leigh Marie Garbowski

(57) ABSTRACT

Combined memories in integrated circuits are described, including determining a first requirement for logic blocks, determining a second requirement for memory blocks including a vertical configuration for the memory blocks, and compiling a design for the integrated circuit using the first requirement and the second requirement. The memory blocks may include non-volatile two-terminal cross-point memory arrays. The non-volatile two-terminal cross-point memory arrays can be formed on top of a logic plane. The logic plane can be fabricated in a substrate. The non-volatile two-terminal cross-point memory arrays may be vertically stacked upon one another to form a plurality of memory planes. The memory planes can be portioned into sub-planes. One or more different memory types such as Flash, SRAM, DRAM, and ROM can be emulated by the plurality of memory planes and/or sub-planes. The non-volatile two-terminal cross-point memory arrays can include a plurality of two-terminal memory elements.

13 Claims, 5 Drawing Sheets

COMBINED MEMORIES IN INTEGRATED CIRCUITS

CROSS-REFERENCES TO RELATED APPLICATIONS

This application is related to U.S. patent application Ser. No. 11/095,026, filed Mar. 30, 2005, now U.S. Published Application No. 2006/0171200, and titled "Memory Using Mixed Valence Conductive Oxides," and is related to U.S. patent application Ser. No. 12/004,740, filed on Dec. 23, 2007, now U.S. Published Application No. 2009/0164203, and titled "Non-Volatile Memory Compiler"

FIELD OF THE INVENTION

The present invention relates to integrated circuits and specifically to combined memories in integrated circuits.

BACKGROUND

An integrated circuit (IC) is a semiconductor device that combines the functions of several discrete electronic components into a single miniature package. For example, an IC may be a logic gate or a microprocessor. An application specific integrated circuit (ASIC) is an integrated circuit (IC) that generally combines the functions of several individual ICs into one IC created for a specific application. For example, ASICs are often used with digital music players or cellular telephones because these devices have a clearly defined use which does not change over time. Many of the functions of these devices may be subsumed by the ASIC rather than including a separate IC for each individual function. ASICs therefore exhibit reduced size, lower cost, and lower power consumption, all of which stem from the reduced number of ICs needed for the specific application.

ASICs include several functional components. For example, an ASIC may include a processor, interfaces such as a network interface, and an internal memory, such as a random access memory (RAM) or a Flash memory. These components may be sourced from standard libraries, leading to a simple process of choosing which components are needed by the ASIC and choosing how to arrange and connect the components.

In many instances, a user may want to use both RAM and Flash memory in an ASIC. One common type of RAM, dynamic RAM (DRAM), is process incompatible with Flash memory. In other words, the semiconductor processing operations for creating the RAM and the semiconductor processing operations for creating the Flash memory are sufficiently different that DRAM and Flash memory cannot be formed within the same IC. In these cases, an ASIC is manufactured with one type of memory, and an additional IC containing the other type of memory and external to the ASIC is used. The additional ICs increase the cost, size, and power consumption of a device.

Conventional ASICs use available memory blocks ("macro" blocks) of a predetermined size, for example one megabyte (MB). Although ASICs are easy to develop with these blocks, the resulting ASICs are limited to predetermined memory sizes, for example, multiples of one MB. Using these examples, if an ASIC designer needs 1.5 MB of memory, the designer is forced to use two MB of memory on their ASIC because the memory is available only in one MB blocks. The additional, unneeded memory increases the cost, size, and power consumption of the ASIC as well as reducing performance.

There are continuing efforts to improve integration of memory into ASICs and other ICs.

BRIEF DESCRIPTION OF THE DRAWINGS

The present invention will be readily understood by the following detailed description in conjunction with the accompanying drawings, and like reference numerals designate like structural elements. Although the Drawings depict various examples of the invention, the invention is not limited by the depicted examples. Furthermore, the depictions are not necessarily to scale.

DETAILED DESCRIPTION

Figure 1A:
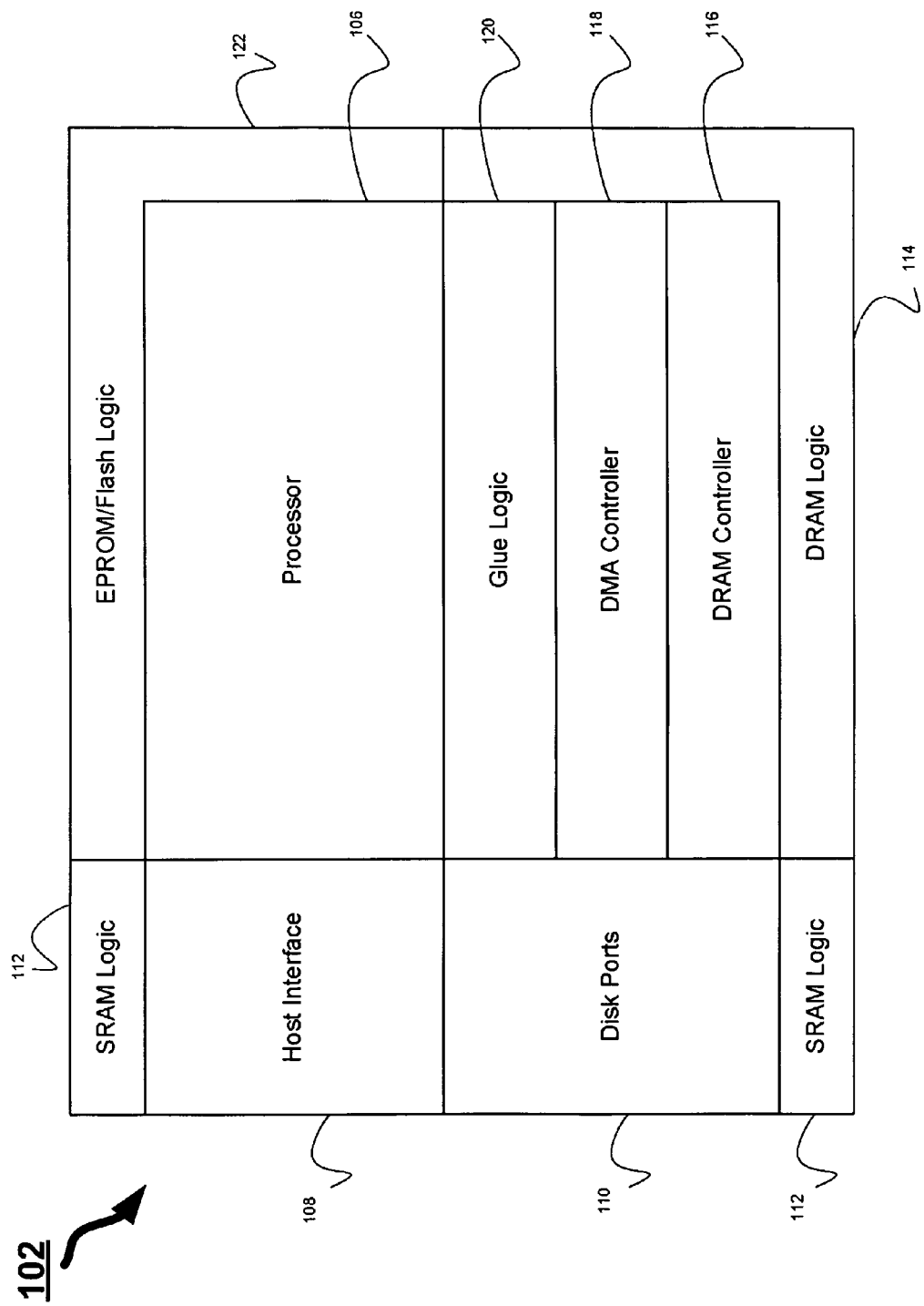
FIGS. 1A and 1B are views of an exemplary integrated circuit (IC) according to one embodiment of the invention.

Embodiments of the invention may be implemented in numerous ways, including as a system, a process, an apparatus, or as computer program instructions included on a computer readable medium such as a computer readable storage medium or a computer network wherein program instructions are sent over optical or electronic communication links.

A detailed description of one or more examples is provided below along with accompanying figures. The detailed description is provided in connection with such examples, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

According to one embodiment of the invention, a method for designing an integrated circuit (IC) is disclosed. The method comprises determining a first requirement for logic blocks, determining a second requirement for memory blocks including determining a vertical configuration for the memory blocks, and compiling a design for the IC using the first requirement and the second requirement. According to a second embodiment of the invention, an IC is disclosed. The IC comprises a first plane including a first logic and a second logic for controlling memory connected to the first logic, and a second plane above the first plane and connected to the second logic including a non-volatile re-writable memory for use by the first logic.

Memory Technology

Non-volatile memory technologies may be used with memory systems to develop high density, low cost, and fast access memories. Access may refer to accessing and performing data operations (e.g., read, write, erase) on a memory or memory array. The memory array may include vertically-configured cell arrays (e.g., vertically-stacked, cross-point, two or three-terminal, non-volatile memory arrays). Advantages of vertically-configured cell arrays include reduced die sizes and manufacturing costs and system-level functionality. Examples of memory arrays may include vertically-stacked, two or three-terminal, cross-point memory arrays, such as those described in U.S. patent application Ser. No. 11/095, 026, filed Mar. 30, 2005, and titled "Memory Using Mixed Valence Conductive Oxides," hereby incorporated by reference in its entirety and for all purposes, describes non-volatile third dimension memory elements (i.e., memory cells) that can be arranged in a cross point array. The application describes a two-terminal memory element that changes conductivity when exposed to an appropriate voltage drop across the two terminals. Multiple layers of the cross-point arrays may be vertically stacked upon one another to form the aforementioned vertically stacked array configuration. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (e.g., such as selection circuitry). The circuitry can be in a logic plane fabricated on a substrate (e.g., a silicon Si wafer) and the memory array can be positioned on top of the substrate. The memory element stores data as a plurality of conductivity profiles that can be non-destructively determined by applying a read voltage across the terminals of the memory element. The memory element retains stored data in the absence of power. The two-terminal memory elements can be arranged in a cross point array such that one terminal is electrically coupled with an x-direction line and the other terminal is electrically coupled with a y-direction line.

Both the electrolytic tunnel barrier and the mixed valence conductive oxide do not need to operate in a silicon substrate and, therefore, can be fabricated above circuitry being used for other purposes. The two-terminal memory elements can be arranged in a cross point array such that one terminal is electrically coupled with an x-direction line and the other terminal is electrically coupled with a y-direction line. A stacked cross point array consists of multiple cross point arrays vertically stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½-$V_{W1}$ to the y-direction line) it switches to a low resistive state. When a second write voltage $V_{W2}$ is applied across the memory element, (typically by applying ½ $V_{W2}$ to the x-direction line and ½-$V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Fast accesses for data operations may be achieved by using page buffers to allow multiple data operations to be performed substantially simultaneously (i.e., buffering data from a read and a write access). Further, various embodiments of data packet formats and data communication protocols may be used to indicate how data from different data operations (e.g., read, write, erase) may be aligned to allow fast accesses to a memory array.

Memory Compiler

A memory compiler is used to create memory blocks. A memory block is a collection of individual memory elements that comprises a subset of a larger memory. A memory compiler can be used to create memory blocks using the above-described memory technology. The memory compiler considers several factors when determining the configuration of memory blocks. A user or other process inputs the amount of memory desired, the type of memory desired, and the physical configuration of the IC (e.g., the footprint). Using the vertically-configured memory technology described above, a memory compiler can create multi-plane memories with multiple interfaces.

A memory compiler for compiling memory blocks using the above-described memory technology is described in U.S. patent application Ser. No. 12/004,740, filed on Dec. 23, 2007, now U.S. Published Application No. 2009/0164203, and titled "Non-Volatile Memory Compiler", which is herein incorporated by reference for all purposes.

Currently available memory compilers can be used to generate static random access memory (SRAM) or read only memory (ROM) configurations, but there is no compiler available for generating dynamic random access memory (DRAM) or Flash memory configurations. Therefore, when they are incorporated into ICs such as ASICs, DRAM and Flash memories are chosen from standard libraries. The memory technology described above can, as will be explained below, be used as a substitute for DRAM or Flash memory. Since the memory technology can be compiled, the flexibility of memory configurations for application specific ICs (ASICs) and other ICs is greatly improved. For example, a developer can generate memories of any size, which are better able to match the requirements of a specific IC.

A compiler may also be used to generate various configurations of logic blocks for an IC. The compiler can be used to assemble the logic blocks into a design based on certain specifications given by the user. For example, a compiler can receive a set of logic blocks to be used with an IC, arrange the logic blocks into a footprint, and interconnect the logic blocks to assemble a functional IC, as will be explained below.

An Exemplary IC

Figure 1B:
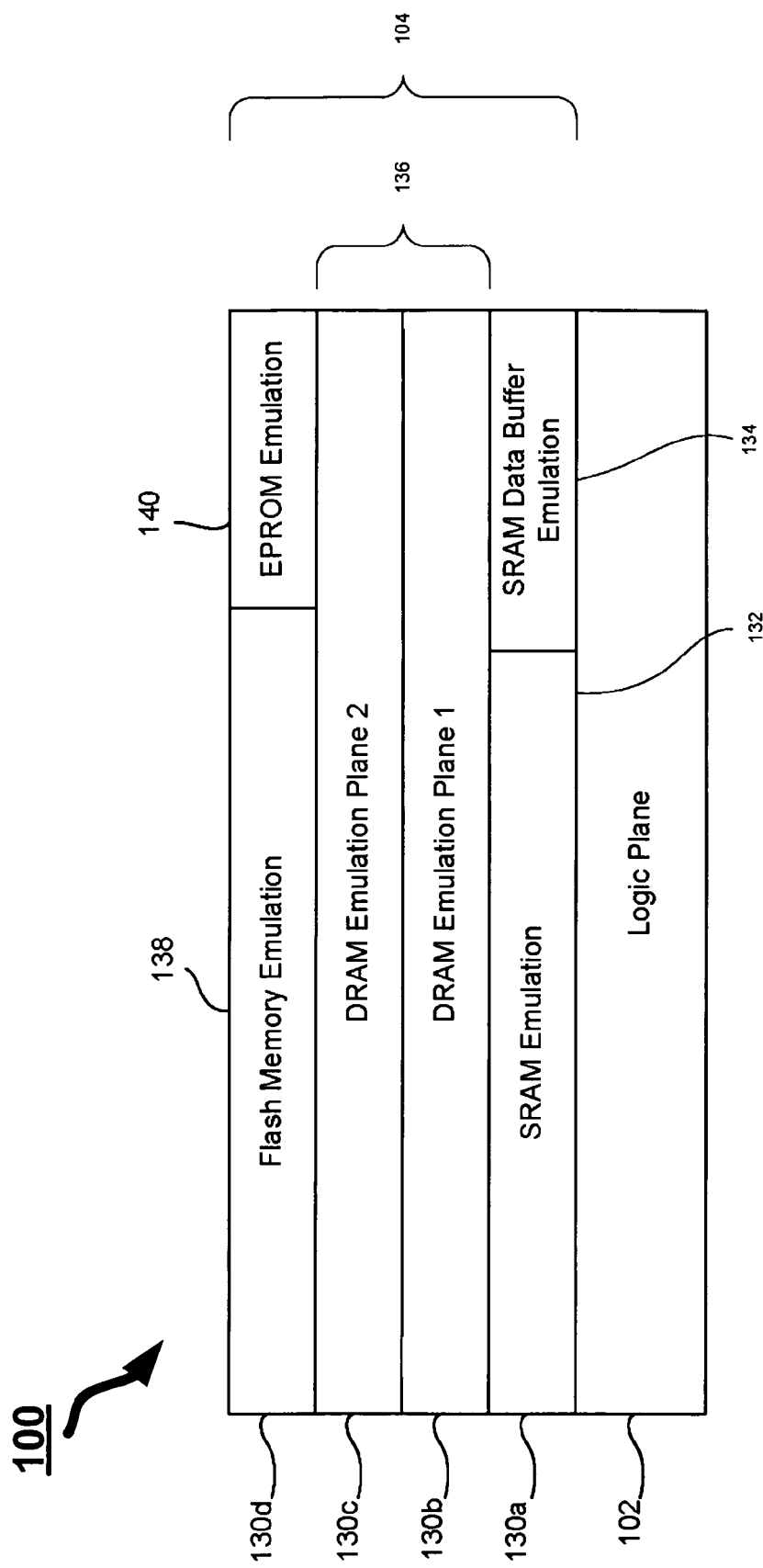

FIGS. 1A and 1B are views of an exemplary IC 100 according to one embodiment of the invention. FIG. 1A is an overhead view of a logic plane 102 of the IC 100, and FIG. 1B is a cross-sectional view showing a vertical configuration of a memory 104 of the IC 100. The IC 100 may be a redundant array of inexpensive disks (RAID) controller according to one embodiment of the invention. It is understood that although a RAID controller is specifically described here that any type of IC or application specific IC (ASIC) may be developed or assembled according to the various embodiments of the invention, and that a RAID controller is shown only as an example of an IC using these techniques. Examples of other types of ICs that may be developed include ASICS used by portable media devices such as digital music players and cellular telephones, networking devices, etc.

The memory technology described above comprises a two-terminal resistivity-sensitive memory element according to one embodiment. The memory technology is also non-volatile. In other words, when power is removed from the memory, the memory retains its contents. In contrast, DRAM and other RAM technologies are volatile, and need constant power in order to retain their contents. Further, unlike DRAM, the memory technology requires no refresh, which improves performance over a comparable DRAM. In contrast to Flash memory, which is also non-volatile, the memory technology requires no erase for writes and does not require an operating system (OS), improving performance. Additionally, the memory elements are physically smaller, increasing densities leading to smaller sizes and reduced power consumption. Finally, since the memory technology can be used to replace both DRAM and Flash memory, the functions of DRAM and Flash memory can be performed using a single memory, eliminating additional ICs when the functions of both a DRAM and a Flash memory are to be used.

ICs using this memory exhibit several advantageous characteristics. First, because the memory (including system memory) is non-volatile, devices can be instantly turned on and off, and do not lose memory contents when power is interrupted. In some devices, battery backups can be eliminated. Second, the reduced size of the IC and reduced number of ICs used in many applications (e.g., an ASIC that uses DRAM and Flash memory can replace both memories with a single memory using the memory technology) lowers production costs and power consumption while reducing device size.

The IC 100 is an ASIC that includes several different functional components. Each of these components is constructed from logic blocks that perform logic functions. The logic blocks may be readily available from standard libraries or specifically designed for the application. The logic blocks are housed in the first, or bottom, plane of the vertically-configured IC 100, which may also be referred to as the logic plane 102. The vertical configuration of memories is described in the reference above. Briefly, the IC 100 has several "planes." The logic plane 102 includes logic elements of the IC 100. The memory 104 is housed in several planes above the logic plane 102, reducing the size of a device using the IC 100.

The logic plane 102 of the IC 100 includes a processor 106, a host interface 108, disk ports 110, static random access memory (SRAM) logic 112, dynamic random access memory (DRAM) logic 114, a DRAM controller 116, a dynamic memory access (DMA) controller 118, glue logic 120, and electronically programmable read only memory (EPROM)/Flash memory logic 122. Any of these logic blocks may be described as "a logic" for the purposes of this disclosure.

The processor 106 may be any type of available processor, such as a microprocessor without interlocked pipeline stages (MIPS) processor or those manufactured by Advanced RISC Machines, Ltd. of Cambridge, United Kingdom. The host interface 108 interfaces with a network or other communications devices, and may include an Ethernet or Fibre Channel interface. The disk ports 110 are hardware interfaces with the various disks of the RAID cluster, and may include a small computer system interface (SCSI), a serial advanced technology attachment (SATA) interface, an Ethernet interface or a Fibre Channel interface. The DRAM controller 116 is a typical memory controller used to manage DRAM emulation and the DRAM logic 114. The DMA controller provides an interface for devices to access the DRAM emulation of the IC 100. The glue logic 120 is a simple logic block that connects complex logic blocks together, in this case the processor 106 and the DMA controller 118.

The SRAM logic 112, DRAM logic 114, and EPROM/Flash memory logic 122 assist in performing memory emulation using the memory technology discussed above. In this context, "emulation" refers to using the memory 104 (FIG. 1B) to perform the function of several previously used memory types. According to one embodiment, the memory 104 may comprise the memory technology described above, however it may perform the functions of several previously-used memory technologies. For example, the memory 104 for the IC 100 may perform DRAM emulation, subsuming the functions of a traditional DRAM, and/or Flash memory emulation, subsuming the functions of a traditional Flash memory. Each of the SRAM logic 112, DRAM logic 114, and Flash memory logic 122 are configured to operate the memory technology described above, however each is configured to operate the memory 104 as though it comprised the previously-used memory types. In other words, according to one embodiment, the IC 100 and its functional components in the logic plane 102 see the memory 104 as several individual memories: one DRAM, one SRAM, one SRAM data buffer, one Flash memory, and one EPROM.

Referring again to FIG. 1B, as mentioned above, the IC 100 includes several vertically configured planes, beginning with the logic plane 102, and a first memory plane 130a, a second memory plane 130b, a third memory plane 130c, and a fourth memory plane 130d above the logic plane 102. The memory 104 comprises the various memory planes 130a-d, which themselves comprise the memory elements described above in a vertical configuration. The planes 102 and 130a-d may be interconnected using a series of vias and other interconnects that can be configured using the compiler, as will be explained below.

According to one embodiment, each of the memory planes 130a-d may be assigned to one or more emulation functions. For example, the first memory plane 130a may be used for SRAM emulation 132 and SRAM Data Buffer emulation 134. SRAM used in previous applications is typically used by a processor as a cache memory, and is characterized by quick access and high throughput. The first memory plane 130a is closest to the logic plane 102, has the lowest capacitance between itself and the logic plane 102, and as a result provides the fastest memory access. Therefore, according to one embodiment, the memory emulation that would benefit from the fastest memory access (i.e., the SRAM emulation 132) is performed using the first memory plane 130a. It is understood that any type of memory emulation, including any type of RAM emulation or ROM emulation may be performed using the memory 104, and that the specific types of emulation mentioned here are examples only.

The second memory plane 130b and the third memory plane 130c are used for DRAM emulation 136. DRAM emulation 136 desires, according to one embodiment, slower access times than SRAM emulation 132 or SRAM Data Buffer emulation 134, but more memory capacity. As a result, DRAM emulation 136 is assigned to the second and third memory planes 130b and 130c, which are above the first memory plane 130a used for SRAM emulation 132 and SRAM Data Buffer emulation 134. The fourth plane 130d is used for Flash memory emulation 138 and for EPROM emulation 140. The Flash memory emulation 138 and the EPROM emulation 140 store information such as firmware information, which is typically accessed infrequently, and therefore slower access is tolerated. In another embodiment, the entire memory 104 may be used for all types of memory uses. Using this embodiment, the memory 104 may be dynamically allocated when it is needed by a specific process.

It is understood that although various comparative memory speeds have been described that a specific access speed is not attributed to any of the memory planes 130a-d. For example, the memory in the first memory plane 130a provides faster access to the logic plane 102 than the fourth memory plane 130d by virtue of the first memory plane 130a being physically closer to the logic plane 102. The fourth memory plane 130d may still provides faster access than a comparative Flash memory or EPROM.

The SRAM logic 112, DRAM logic 114, and EPROM/Flash memory logic 122 are constructed from logic blocks and control the vertically configured memory blocks configured in the memory planes 130a-d in this embodiment. Each of the SRAM logic 112, DRAM logic 114, and Flash memory logic 122 include memory logic components such as a memory controller and cell sensors that can be used to access the memory in the planes above the plane shown in FIG. 1A.

It is understood that other memory logics may be used either in addition to or in place of the SRAM logic 112, DRAM logic 114 and EPROM/Flash memory logic 122 described here. For example, other types of memories, such as enhanced DRAM (EDRAM), synchronous DRAM (SDRAM) may be emulated, and their associated logics may be formed in the logic plane 102.

Figure 2A:
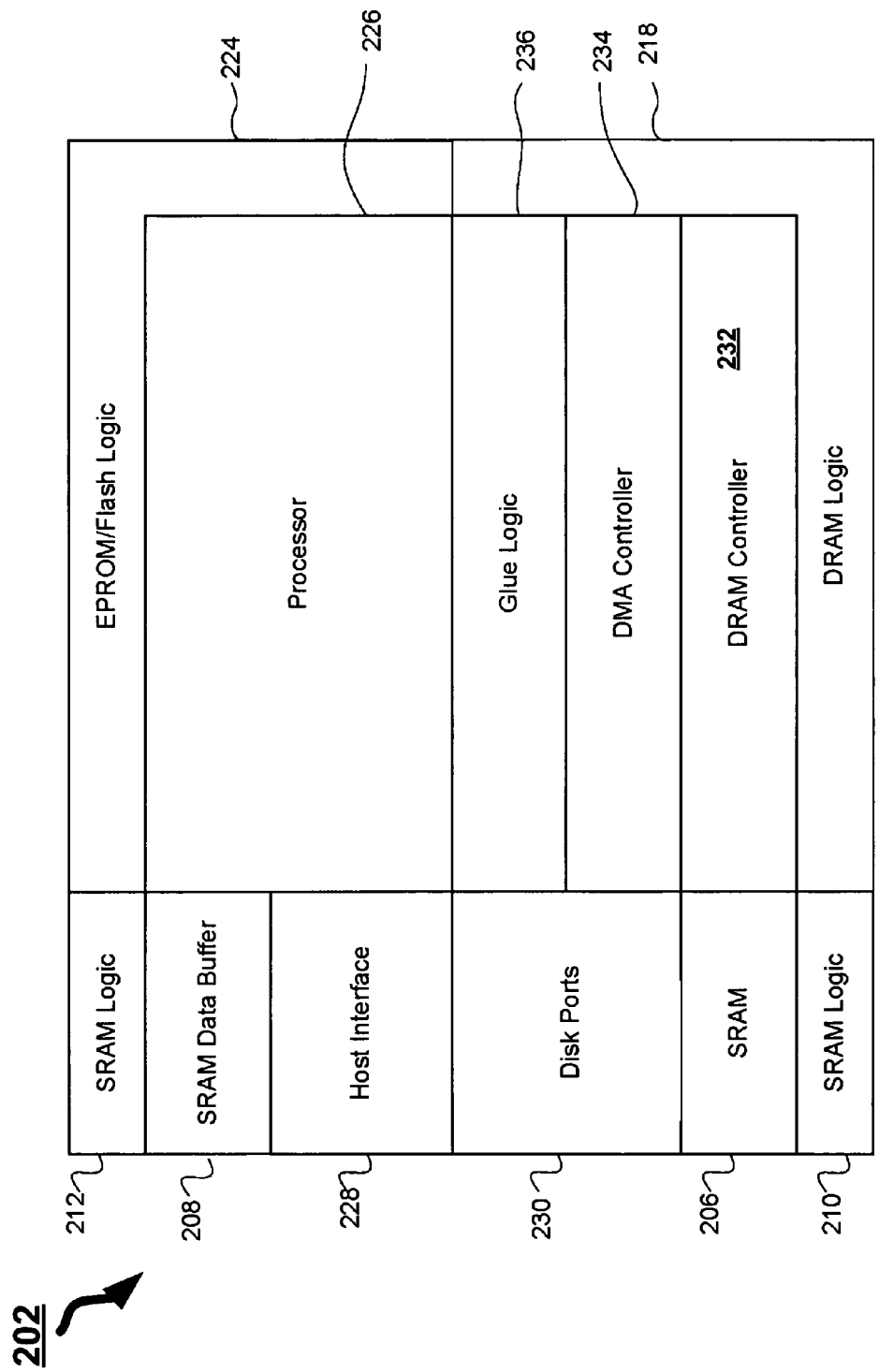
FIGS. 2A and 2B depict an alternative IC including memory in a logic plane.
Figure 2B:
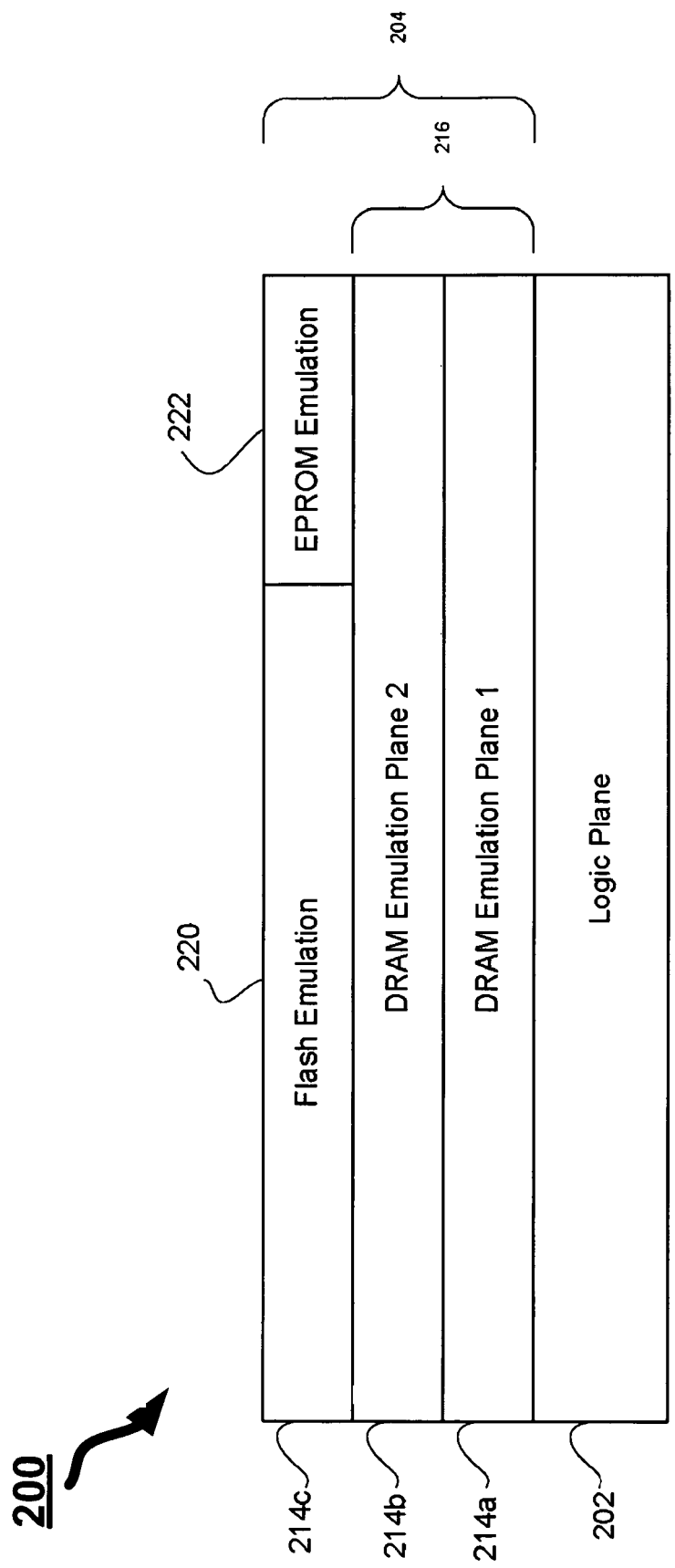

FIGS. 2A and 2B illustrate an alternative IC 200 including memory in a logic plane 202. FIG. 2A illustrates an overhead view of the logic plane 202 and FIG. 2B illustrates a cross-sectional view of the IC 200 including a vertically-configured memory 204. In some embodiments of the invention, it may be desirable to include memory in the logic plane 202. According to one embodiment, SRAM memory 206 and SRAM data buffer 208 may be included in the logic plane 202 to increase performance of the IC 200. For example, since SRAM is the highest performance memory typically used by ASICs, emulating SRAM in the logic plane 202 can improve performance of the SRAM emulation because of reduced capacitance due to shorter interconnects between the SRAM emulation 206 and SRAM logic 210 and between the SRAM Data Buffer emulation 208 and SRAM logic 212.

The vertically-configured memory 204 includes several memory blocks that are dedicated to a specific memory emulation function. As shown here, the memory 204 includes a first plane 214a, a second plane 214b, and a third plane 214c. The first plane 214a and the second plane 214b are used for DRAM emulation 216. The DRAM emulation 216 is controlled by DRAM logic 218 in the logic plane 202. The third plane includes Flash memory emulation 220 and EPROM emulation 222. The Flash memory emulation 220 and the EPROM emulation 222 are controlled by EPROM/Flash memory logic 224 in the logic plane 202.

The IC 200 also includes a processor 226, a host interface 228, disk ports 230, a DRAM controller 232, a DMA controller 234, and glue logic 236. The functions of these components were described above regarding FIG. 1A.

Process for Designing an IC

Figure 3:
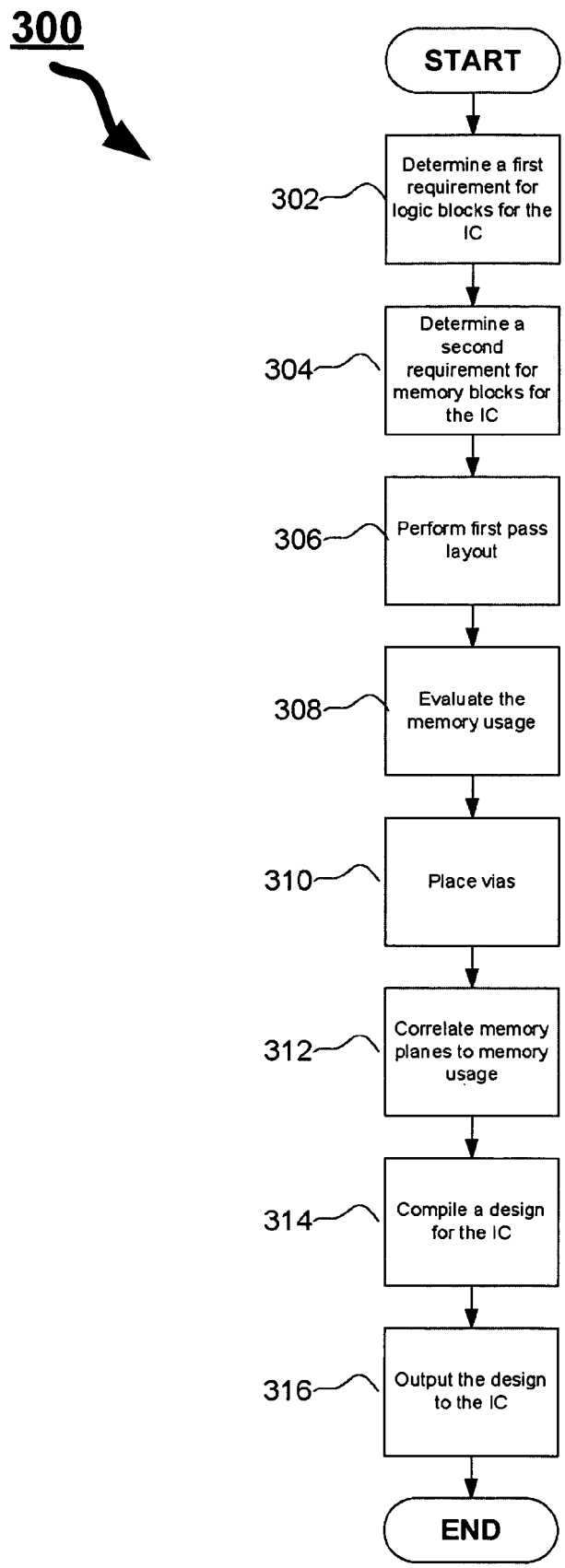
FIG. 3 is a flowchart depicting a process for designing an IC according to one embodiment of the invention.

FIG. 3 is a flowchart describing a process 300 for designing an IC according to one embodiment of the invention. The process 300 may be used to design one of the IC 100 or the IC 200 as well as any other IC that includes integrated memory. The process 300 generally includes determining requirements for logic blocks and memory blocks, generating a layout for the IC and compiling the layout to determine an IC design. The IC design can then be used to manufacture the IC.

At a stage 302, a first requirement for logic blocks for the IC is determined. Logic blocks, as described above, are functional circuits that may be pre-configured (i.e., taken from standard libraries) or specially designed for the particular application. Determining the first requirement may include determining a number and type of logic blocks needed for the IC. A designer or another process may determine the type of logic blocks needed for the IC. For example, an ASIC may use a processor, various interfaces, and one or more other logic blocks that are readily available. Determining the first requirement, according to an embodiment, may include receiving design parameters such as those specified by a designer. The compiler can then use the design parameters to generate various logic components used for memory access, such as interface circuitry, address decoder logic, data buffers, and sense amplifiers.

At a stage 304, a second requirement for memory blocks for the IC is determined. The second requirement may include a number and type of memory blocks to be used with the IC. The second requirement may include a number of non-volatile re-writable memory blocks such as those formed from the memory technology described above. For example, the memory blocks may include a two-terminal resistivity-sensitive memory element that exhibits the features and advantages described above. Determining a type of memory blocks may, in one embodiment, refer to determining which types of memory emulation will be included with the IC. For example, one IC may include DRAM emulation and SRAM emulation, while another IC uses DRAM emulation and Flash memory emulation. In addition to determining the types of memory emulation used by the IC, the amount of memory to be used by the IC is also determined. In this context, it can be said that the number of memory blocks is chosen to suit the application. Here, a memory block may be as small as a single memory element (one 'bit') so that a designer may use the appropriate amount of memory for the IC.

For example, in determining the second requirement, a designer may determine that a RAID ASIC (such as the one described above) needs one megabyte (MB) of memory for DRAM emulation, one MB of memory for Flash memory emulation, and 128 kilobytes (KB) of memory for SRAM emulation. The designer could then specify that 2.125 MB of total memory are to be used with the ASIC. The memory, even though it includes different portions performing different functions, is otherwise homogenous, and only a single memory is designed for the ASIC. The physical configuration of the memory is determined later based on not only the second requirement, but also on other characteristics of the IC being designed.

At a stage 306, a first pass layout is performed. The first pass layout assembles the various logic blocks chosen above into a preliminary configuration of the logic plane of the IC. The first pass layout may be performed by a compiler, as described above, or by a designer or user. The first pass layout makes a preliminary determination of the relative location of the logic blocks in the logic plane and the die size of the IC.

For example, a designer may have determined that a processor, a network interface, an SRAM logic, a DRAM logic, and a Flash logic are all needed for an IC. These logic blocks may be sourced from various standard libraries or specially designed, as needed, for the application. During the first pass layout, each of these blocks is configured into a logic plane design and interconnected. A compiler may be able to offer several possible configurations for the designer to consider. The designer can evaluate each of these potential configurations, considering several different variables. For example, it may be desirable in some instances to place certain logic blocks near each other. Other considerations include reducing the overall die size of the IC and placing memory logic near the perimeter of the IC (as shown above) to improve memory access.

At a stage 308, the memory usage of the IC is evaluated. A designer or user can examine the first pass layout to determine the number and configuration of the memory planes. Based on the chosen design of the logic plane, which can be reconfigured at this point, the designer can determine the die size of the logic plane. Knowing the die size, the number of planes of memory can be determined to meet the needs of the IC as determined in stage 304. For example, the designer may know that 2.125 MB of memory are needed for a specific IC design. The designer may be able to determine that the memory can be divided into four planes which fit above the chosen logic plane configuration. If the designer is unhappy with the memory configuration, the designer can reconfigure the logic plane to change the die size and accommodate different plane sizes.

At a stage 310, the vias for the memory planes are placed. Vias are vertical electrical interconnects. For example, a via may be placed in one of the memory logics (e.g., the DRAM logic 114), which is then connected, either directly or through a network of vias and other interconnects, to the appropriate memory location. For example, considering the IC 100, vias are located in the DRAM logic 114, which are connected to the second plane 130b and the third plane 130c to connect the DRAM emulation 136 to the DRAM logic 114. According to an embodiment, placing the vias may include designing an interconnect structure between a memory logic (such as one of the SRAM logic 112 or DRAM logic 114) and memory blocks in the memory planes 130a-130d.

At a stage 312, the memory planes are correlated to the memory usage. Each memory plane is assigned its function here. For example, if, according to the die size, each memory plane holds one megabyte (MB) of memory, and four MBs of memory are used for the IC, then four memory planes are needed. If 512 kilobytes of Flash memory emulation are needed, then one half of one memory plane may be assigned to Flash memory emulation. Similarly, if two MBs of DRAM emulation are needed, two memory planes may be assigned to DRAM emulation. The location of the memory emulation (e.g., the Flash memory emulation is located in the top plane) may also be determined. As above, the compiler may be used to iterate through various memory configurations. The designer then determines which configuration is appropriate based on aspect ratio, memory partitioning, memory usage, etc. According to an embodiment, the process 300 determines a number of planes and a memory density for the memory blocks based on a die area of the integrated circuit and a number of non-volatile re-writeable memory blocks (i.e., memory blocks) for the integrated circuit.

At a stage 314, a design for the IC is compiled. Here, a design refers to a final design that is used to output the design to the IC. After the developers have iterated through enough possible logic and memory configurations, the final design is inputted into the compiler. The resulting design can be used to manufacture the IC.

At a stage 316, the design is outputted to an IC. Outputting the design to the IC involves several microelectronics processing operations that are well known in the art and may include but is not limited to generating a mask set, fabricating the IC using one or more semiconductor processes, and packing the IC in a suitable package, just to name a few. Additionally, the processes for fabricating the memory technology described above are described in the referenced documents. In general, the IC can be manufactured by fabricating the logic plane including the logic blocks and vias in the logic plane, and subsequently forming memory planes in the determined configurations over the logic plane, interconnecting the memory planes to the logic plane through the vias. It is understood that various other processing techniques may be used.

With the above embodiments in mind, it should be understood that embodiments of the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Embodiments of the invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A non-transitory computer readable medium having program instructions configured to execute on and cause a computer system to perform a method of designing an application specific integrated circuit (ASIC) having vertically integrated non-Flash re-writeable non-volatile memory, comprising the steps of:
   determining a first requirement for logic blocks included in a logic plane fabricated on a silicon substrate, at least a portion of the logic blocks operative to perform data operations on a plurality of non-volatile re-writeable resistivity-sensitive two-terminal memory elements configured in one or more two-terminal cross-point memory arrays that are electrically coupled with the logic blocks;
   determining a second requirement for memory blocks including determining a vertical configuration for the memory blocks, the memory blocks are positioned in one or more memory planes in contact with and fabricated directly above the silicon substrate, each memory plane including at least one of the two-terminal cross-point memory arrays, and the one or more memory planes are vertically stacked upon one another according to the vertical configuration;
   compiling a design for fabricating an integrated circuit (IC) that includes the memory blocks in contact with and vertically, fabricated directly above the silicon substrate using the first requirement and the second requirement; and
   outputting the design for the IC in at least one non-transitory computer readable medium.

2. The method of claim 1 and further comprising:
   performing a first pass layout using the first requirement; and
   evaluating memory usage based on the first pass layout,
   wherein the compiling the design for fabricating the IC considers the evaluating.

3. The method of claim 1, wherein the determining the first requirement comprises determining a type and a first number of logic blocks for the IC.

4. The method of claim 3, wherein the determining the second requirement comprises determining a second number of non-volatile re-writeable memory blocks and determining a third number of memory planes needed for the second number of non-volatile re-writeable memory blocks.

5. The method of claim 4 and further comprising:
   determining the third number of memory planes and a memory density for the memory blocks based on a die area of the IC and the second number of non-volatile re-writeable memory blocks.

6. The method of claim 1, wherein the determining the second requirement for memory blocks comprises determining an amount of memory for random access memory (RAM) emulation and an amount of memory for Flash memory emulation.

7. The method of claim 1, wherein the compiling the design for the IC comprises designing an electrically conductive interconnect structure between a memory logic included in the logic blocks of the logic plane and the memory blocks.

8. The method of claim 1, wherein determining the first requirement for logic blocks comprises receiving design parameters and generating interface circuitry, address decoder logic, data buffers, and sense amplifiers from the design parameters.

9. A computer program product embodied in a non-transitory computer readable medium and configured to execute on and cause a computer system to perform a method of designing an application specific integrated circuit (ASIC) having vertically integrated non-Flash re-writeable non-volatile memory, comprising the steps of:
   determining a first requirement for logic blocks to be fabricated in a logic plane of a silicon substrate;
   determining a second requirement for memory blocks including determining a vertical configuration for one or more memory planes the memory blocks are configured in, the one or more memory planes are in contact with and are fabricated directly above the silicon substrate with the memory blocks in electrical communication with at least a portion of the logic blocks;
   compiling a design for fabricating an integrated circuit (IC) using the first requirement and the second requirement; and
   outputting the design for the IC in at least one non-transitory computer readable medium.

10. The computer program product of claim 9 and further comprising:
    performing a first pass layout using the first requirement; and
    evaluating memory usage based on the first pass layout, wherein the compiling the design for fabricating the IC considers the evaluating.

11. The computer program product of claim 9, wherein the determining the first requirement comprises determining a type and a first number of logic blocks for the IC.

12. The computer program product of claim 11, wherein the determining the second requirement comprises determining a second number of non-volatile re-writeable memory blocks and determining a third number of memory planes needed for the second number of non-volatile re-writeable memory blocks.

13. A non-transitory computer readable medium having program instructions configured to execute on and cause a computer system to perform a method of designing an application specific integrated circuit (ASIC) having vertically integrated non-Flash re-writeable non-volatile memory, comprising the steps of:
    determining a first requirement including a number and type of logic blocks to be fabricated in a logic plane of a silicon substrate for an integrated circuit (IC);
    determining a second requirement including a number and type of memory blocks for the IC;
    performing a first pass layout using the first requirement and evaluating memory usage based on the first pass layout;
    correlating memory planes for the IC based on the second requirement, each memory plane including at least one of the memory blocks, and the memory planes are in contact with and are fabricated directly above the silicon substrate and the memory blocks are electrically coupled with at least a portion of the logic blocks;
    compiling a design for fabricating the IC based on the evaluating and the correlating; and
    outputting the design for the IC in at least one non-transitory computer readable medium.

* * * * *